United States Patent
Fumihira

(10) Patent No.: US 6,657,293 B1
(45) Date of Patent: Dec. 2, 2003

(54) CHIP SCALE PACKAGE IN WHICH LAYOUT OF WIRING LINES IS IMPROVED

(75) Inventor: Ryuujin Fumihira, Tokyo (JP)

(73) Assignees: NEC Corporation, Tokyo (JP); NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/679,805

(22) Filed: Oct. 5, 2000

(30) Foreign Application Priority Data

Oct. 5, 1999 (JP) .......................................... 11-284929

(51) Int. Cl.[7] .......................... H01L 23/04; H01L 23/48; H01L 23/52
(52) U.S. Cl. ...................... 257/698; 257/690; 257/691; 257/692; 257/730; 257/773; 257/778; 257/786; 257/737; 257/738; 257/780
(58) Field of Search ................................ 257/698, 778, 257/780, 730, 773, 786, 691, 738, 734; 361/742, 772

(56) References Cited

U.S. PATENT DOCUMENTS 5,686,764 A * 11/1997 Fulcher ........................ 527/778
5,729,894 A * 3/1998 Rostoker et al. .............. 29/832
5,905,303 A * 5/1999 Kata et al. .................... 257/701
5,977,626 A * 11/1999 Wang et al. .................. 257/707
6,038,135 A * 3/2000 Higashiguchi et al. ....... 361/778
6,144,090 A * 11/2000 Higashiguchi ............... 257/693
6,249,047 B1 * 6/2001 Corisis ......................... 257/691
6,285,560 B1 * 9/2001 Lyne ............................ 361/760

FOREIGN PATENT DOCUMENTS

EP          0 892 274        1/1999

* cited by examiner

Primary Examiner—Tom Thomas
Assistant Examiner—Nitin Parekh
(74) Attorney, Agent, or Firm—Katten Muchin Zavis Rosenman

(57) ABSTRACT

A semiconductor device of the present invention includes: a semiconductor chip having an electrode at a periphery thereof, a wiring board having a first surface and a second surface, the first surface of the wiring board being attached to the semiconductor chip, the board having an opening to expose the electrode of said semiconductor chip, and an external terminal arranged on the second surface of the wiring board and arranged inside of the wiring board compared with the opening. The semiconductor device has a wiring line laid on the second surface of the wiring board to electrically connect the electrode and the external terminal. The wiring line extends outside of said wiring board from the external terminal and detours said opening to reach the electrode.

11 Claims, 3 Drawing Sheets

CHIP SCALE PACKAGE IN WHICH LAYOUT OF WIRING LINES IS IMPROVED

BACKGROUND OF THE INVENTION

1. Field of the Invention

The invention relates to a semiconductor device, and more particularly, a wiring line layout of a chip scale (size) package (CSP) for interconnecting chip pads of a semiconductor chip and external terminals of the package.

2. Description of the Related Art

The CSP is, in size, equal to or a little larger than a chip employed, and is used as a high-density type package miniaturized in size as compared to the chip size.

Although the CSPs are roughly classified into area-type (in which terminals are arranged in a lattice on the package surface) packages represented by BGA and LGA and peripheral type (in which terminals are arranged at a periphery) packages represented by SOP, SON, QFP, and QFN, the invention relates to the area-type CSPs.

Recently, the BGA-type CSPs are widely used in which the external terminals are arranged as a solder ball.

FIG. 3 shows a conventional BGA-type CSP 1. FIG. 3A is its bottom view, FIG. 3B is its side view, and FIG. 3C is an expanded view of part A of FIG. 3A.

In the conventional BGA-type CSP 1, external terminals 14 are arranged on the surface of a semiconductor chip 15a. The conventional BGA-type CSP 1 comprises, in configuration, a wiring line board 11, a wiring line-board opening 12 provided near the periphery of the wiring line board 11, a wiring line 13 laid on the bottom of the wiring line board 11, an external terminal 14 arranged on the bottom of the wiring line board 11, a semiconductor chip 15a a little smaller in size than the wiring line board 11 and mounted, as facing downward, on the top surface of the wiring line board 11, a chip pad 16 arranged at the periphery of the semiconductor chip 15a, and a reinforcing resin 17 applied to the side surface of the semiconductor chip 15a and the periphery of the top surface of the wiring line board 11.

The conventional BGA-type CSP1 has its external terminals arranged on the semiconductor chip surface, so that, as shown in FIG. 3C, in a direction from the outside of the package to the inside, the periphery of the wiring line board 11, the periphery of the semiconductor chip 15a, the chip pad 16, and the outer-most peripheral external terminal 14 are arranged in this order. Also, in a region where the chip pad 16 is arrayed, the wiring line-board opening 12 is provided, through which the chip pad 16 is exposed on the side of the bottom of the package. In addition, the wiring line 13 is provided to interconnect the external terminal 14 and the chip pad 16, thus providing electrical conductivity between them. For this purpose, the wiring line 13 starts from the chip pad 16 and goes to the inside to reach the periphery of the wiring line-board opening 12 and then goes around over the wiring line board 11, thus reaching the external terminal 14.

With the conventional BGA-type CAP1, however, the area for laying the wiring line 11 is arranged within the chip pad 16 and so limited to the area on such an area on the wiring board 11 except the area for laying the external terminal 14. Therefore, as the semiconductor chip 15a is reduced in size, the wiring area is also reduced. With a reduced wiring area, the wiring is rendered difficult or impossible to conduct, which leads to a problem. Since the array of the external terminals 14 is specified by the domestic standards or the international standards, an extra space between the external terminals on the wiring board cannot be changed unless these standards are not changed. Therefore, the above-mentioned problem that with a decreasing size of the semiconductor chip 15a the wiring is difficult or impossible to conduct would occur not in the extra space between the external terminals but in an area between the chip pad 16 and the external terminal. If a CSP is manufactured even when wiring is difficult to conduct in this area between the chip pad 16 and the external terminal, there occurs such a problematical risk that the chip pad 16 may be damaged due to difficulty in wiring pattern designing and thermal stress loads. These problems make up an obstacle against reduction in the chip size demanded by desired improvements in the fine patterning degree, operation speed, and power dissipation of the semiconductor devices.

SUMMARY OF THE INVENTION

In view of the above, it is an object of the invention to provide a semiconductor device that is free from the difficulty in designing of the wiring pattern as well as the damage etc. of the chip pad 16 caused by the thermal stress loads applied after the connection process, to secure stable bonding and higher reliability and also easy reduction in the chip size.

A first aspect of the invention is a semiconductor device which comprises:

a semiconductor chip having an electrode at its periphery; a wiring board on which the above-mentioned semiconductor chip is bonded; an opening for exposing the wiring board partially; an external terminal arranged on the above-mentioned wiring board in such a way as to be provided opposite to the above-mentioned semiconductor chip and also inside as viewed from the above-mentioned opening; and a wiring line laid over a surface on which the external terminal of the above-mentioned wiring board is arranged, for electrically interconnecting the above-mentioned electrode and the above-mentioned external terminal, wherein a passage of the above-mentioned wiring line is set in such a way that the above-mentioned wiring line may start from the above-mentioned external terminal and go out of the above-mentioned opening, thus reaching the above-mentioned electrode.

According to the semiconductor device of the invention, an area which is outside as viewed from the opening formed in the wiring board is also utilized as a wiring-line laying area, to obtain a sufficient extra space for wiring, thus providing such an effect that the wiring area may not be reduced due to a change in the chip size or the chip pad position.

Therefore, failures hardly occur in reducing the chip size. The semiconductor device of the invention utilizes an extra space around the opening of the required spaces on the wiring board, to lay the wiring line, thus avoiding a situation where the wiring is difficult to impossible to conduct. The difficulty of wiring can be avoided without changing the external terminal, so that the conformity in terms of the array of the external terminals can be kept to the domestic and international standards. With this, the above-mentioned configuration of the semiconductor device according to the invention makes it possible to design a nonrestrictive and stable wiring pattern. In the case of downward-facing bonding, if the distance from the periphery to the chip pad, i.e. distance for wiring therebetween, is too short, stress due to a difference in the thermal expansion coefficient of the package constituting materials is applied to the pad, which is thus liable to be damaged. According to the invention, the wiring line starts from the outer-side periphery of the peripheries of the outer-peripheral opening, to connect to the pad, thus making it possible to provide a sufficiently large distance between the opening periphery and the chip pad. Therefore, the occurrence of a failure such as damage of the chip pad is suppressed which is due to thermal stress loads applied after the connection processes are finished, thus maintaining and even improving the package reliability.

BRIEF DESCRIPTION OF THE DRAWINGS

The above mentioned and other objects, features and advantages of the present invention will become more apparent by reference to the following detailed description of the invention taken in conjunction with the accompanying drawings, in which.

DESCRIPTION OF THE PREFERRED EMBODIMENTS

The following will describe one embodiment of the invention with reference to the drawings. A semiconductor device according to the embodiment is a semiconductor package for bonding thereto a semiconductor chip using the TAB technology, i.e. a semiconductor package employing the BDGA method for external connection, so-called a BGA-type CSP (see FIG. 1).

Figure 1A:
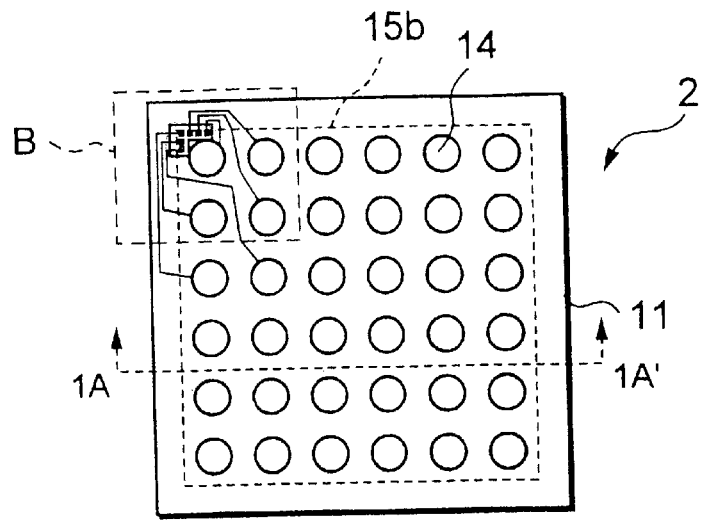
FIG. 1A is a bottom view of a BGA-type CSP of the embodiment.
Figure 1B:
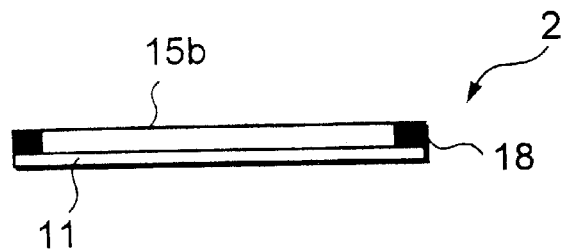
FIG. 1B is its side view.
Figure 1C:
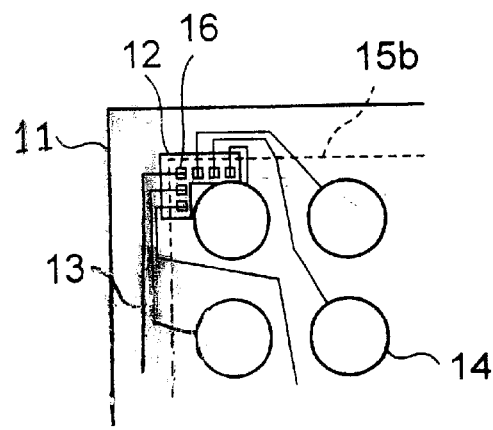
FIG. 1C is an expanded view of a part B of FIG. 1A.

Referring to FIGS. 1A–1C, the BGA-type CSP 2 of the embodiment has external terminals 14 arranged on a surface range of the semiconductor chip. The BGA-type CSP 2 of the embodiment comprises: a wiring board 11; an opening 12 in the wiring board formed near the periphery of the wiring board 11; a wiring line 13 laid on the bottom of the wiring board 11; an external terminal 14 arranged on the bottom of the wiring board 11; a semiconductor chip 15b installed on the top surface of the wiring board 11 in a downward-facing manner and a little smaller than the wiring board 11, and a chip pad 16 arranged at the periphery portion of the semiconductor chip 15b on its surface.

Since the BGA-type CSP 2 of the embodiment has the external terminal 14 arranged in the semiconductor-chip surface range, as shown in FIG. 1C, in a direction from the outside of the package to its inside, the periphery of the wiring board 11, the periphery of the semiconductor chip 15b, the chip pad 16, and the outermost external terminal 14 are arranged in this order. Also, the wiring board opening 12 is provided in the array area of the chip pad 16, to thereby expose the chip pad 16 to the bottom side of the package. Further, the wiring line 13 interconnects the external terminal 14 and the chip pad 16, thus providing electrical conductivity therebetween.

In the case of the BGA-type CSP 2 of the embodiment, the wiring line 13, after starting from the chip pad 16, goes toward outside to reach the outer-side periphery of the peripheries of the wiring-board opening 12 and goes around over the wiring board 11, which is outside as viewed from the wiring-board opening 12 and then passes by the wiring-board opening 12, thus reaching the external terminal 14.

That is, such an area on the wiring board 11 that is outside as viewed from the chip pad 16 is used as the area for laying the wiring line 11 therein.

The semiconductor chip 15b, on the other hand, has a smaller size as against the external terminal 14 arrangement area than that for the semiconductor chip 15a. Therefore, the chip pad 16 gets close to the outermost-peripheral external terminal 14. Even when such a semiconductor chip 15b is installed, by the BGA-type CSP 2 of the embodiment, the area on the wiring board 11 which area is outside as viewed from the chip pad 16 is also utilized as the wiring line 11 laying area, thus avoiding narrowing of the wiring-line laying area and hence the difficulty in wiring. The semiconductor chip 15a can, of course, be installed, in which case, the extra space on the wiring board 11 around the wiring-board opening 12 can be used as the wiring laying area, thus facilitating the designing of the wiring pattern.

By the way, in many kinds of semiconductor chips, there is a semiconductor chip which has chip pads only arranged at its four corner and its center. Such a semiconductor chip does not have any chip pads on its edge between corners. The semiconductor chip is attached to a wiring board. The wiring board has several wiring-board openings to expose the chip pads on the semiconductor chip. For example, the wiring board has five openings arranged at its four corner and its center. Each of the five openings corresponds to the respective five groups of chip pads arranged at the four corner and the center of the semiconductor chip. The package shown in FIGS. 1A to 1C is an example of the package having a semiconductor chip, including five groups of chip pads arranged at its four corner and its center, and a wiring board, including five openings each exposing the respective groups of chip pads, in fact.

Such the above package is suitable to the present invention. That is, since there is no chip pads between the corners of the semiconductor chip, there is no openings between the corners of the wiring board. Therefore, the wiring lines 13, arranged from the openings 12 toward the outer side of the wiring board 11, are connected to the external terminals 14 through the area where there is no openings and pads between the corners.

The BGA-type CSP 2 of the invention is provided with a reinforcing resin frame 18 as shown in FIG. 1B. The reinforcing resin frame 18 is provided on the peripheral portion of the semiconductor chip 15b. Also, the reinforcing resin frame 18 is bonded to the peripheral portion of the wiring board 11 which projects out of the area for bonding of the wiring board 11 and the semiconductor chip 15b, thus supporting the peripheral portion of the wiring board 11. Therefore, the peripheral portion of the wiring board 11 projecting out of the area for bonding with the semiconductor chip 15b can be reinforced, to avoid excessive stress applied to the wiring line laid on such a peripheral portion, thus protecting the wiring line.

The wiring board 11 is made of a polyimide tape etc. The chip pad 16 is made of an Al pad etc. The external terminal is made of a solder ball etc. The reinforcing resin frame 18 is made of an epoxy resin etc. The semiconductor chip 15b and the wiring board 11 are bonded with an adhesive agent.

The following will describe the processes of manufacturing the BGA-type CSP 2 of the invention with reference to FIGS. 2A–2E. After a wiring board having such a structure as mentioned above is manufactured, such processes as a chip-mount process (FIG. 1A), a chi-mount cure process (FIG. 2B), an inner-lead bonding process (FIG. 2C), a solder-ball attaching process (FIG. 2D), and a reinforcing resin frame adhering process (FIG. 2E) in this order are performed.

Figure 2A:
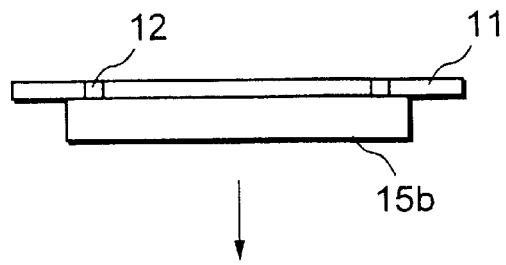
FIGS. 2A to 2E are a flow diagram, side view, indicating in order the processes from chip mounting to reinforcing resin-frame attaching of the processes of manufacturing the BGA-type CSP of the embodiment.
Figure 2B:
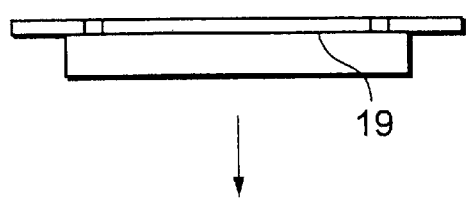

The semiconductor chip 15b is installed on the wiring board 11. In this case, a chip pad which provides an electrode on the semiconductor chip is arranged at the wiring-board opening 12 (FIG. 2A). On the surface of the wiring board 11 which comes in contact with the semiconductor chip 15b is applied a thermoplastic adhesive agent 19, thus thermocompression-bonding the semiconductor chip 15b and the wiring board 11 to each other (FIG. 2B).

Figure 2C:
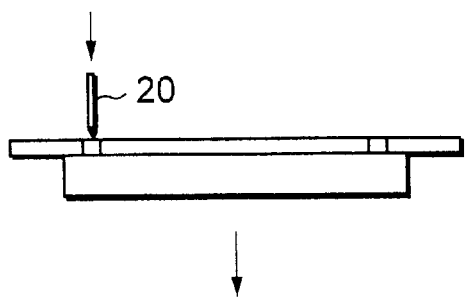

An inner lead is connected to the chip pad. On the inner-lead surface which faces the chip pad at the wiring board opening 12 is formed an inner bump (now shown) beforehand. The inner bump is made of a copper-made core thinly plated with Au at least on its contact surface with the chip pad, so as to be alloy-bonded with the chip pad by use of Au and Al. Above the chip pad, a tool 20 is lowered onto the inner lead surface, to heat and pressure the inner bump and the chip pad, thus bonding them together. At the same time, the tool 20 is used to cut off the unnecessary parts of the inner lead (FIG. 2C).

Figure 2D:
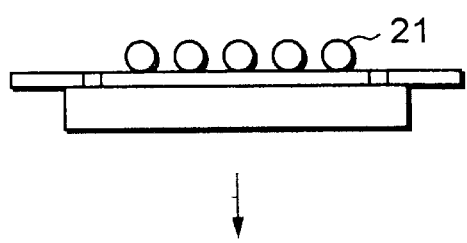
Figure 2E:
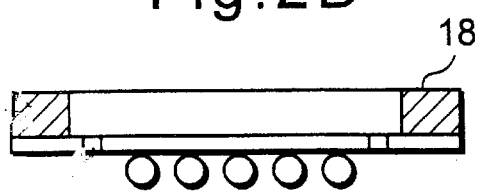
Figure 3A:
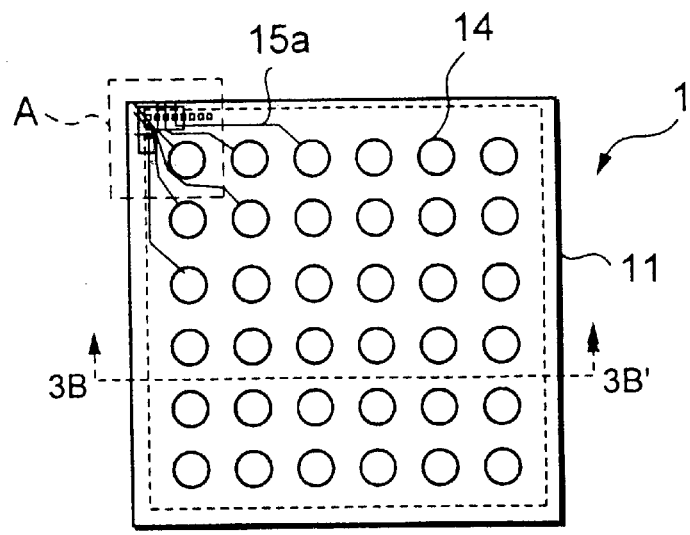
FIG. 3A is a bottom view of a conventional BGA-type CSP1.
Figure 3B:
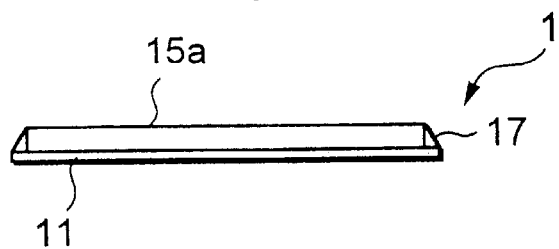
FIG. 3B is its side view.
Figure 3C:
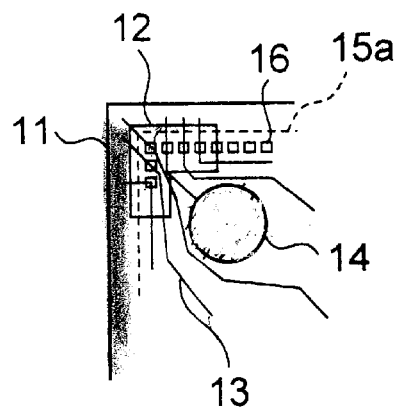
FIG. 3C is an expanded view of a part A of FIG. 3A.

Next, a solder ball 21 is set at the landing part of the wiring pattern and heated and melted to be bonded to the bottom of the package (FIG. 2D).

Next, the reinforcing resin frame 18 is adhered. The inner peripheral surface of the reinforcing resin frame 18 is bonded to the outer peripheral surface of the semiconductor chip 15b, thus bonding the bottom of the reinforcing resin frame 18 to the peripheral surface of the wiring board 11.

The chip mount process, the chip mount cure process, the inner-lead bonding process, the solder-ball attaching process, and the reinforcing resin frame attaching process can be utilized as they are. That is, no new facilities nor processes are required to manufacture the BGA-type CSP 2 of the embodiment, which can thus be manufactured by the existing semiconductor assembly/manufacture facilities.

The BGA-type CSP 2 of the embodiment is just one embodiment of those according to the invention. The semiconductor chip may be bonded in an upward-facing manner. The internal connection may be made not by the TAB technology but by the wire bonding technology using a wire as the inner lead. In any case, the effects of the invention can be obtained.

What is claimed is:

1. A semiconductor device comprising:
    a semiconductor chip having an electrode at a periphery thereof;
    a wiring board having a first surface and a second surface, said first surface of said wiring board being attached to said semiconductor chip, said board having an opening to expose said electrode of said semiconductor chip;
    an external terminal arranged on said second surface of the wiring board and arranged inside of said wiring board compared with the opening; and
    a wiring line laid electrically connecting the electrode and the external terminal,
    said wiring line extending toward an outside direction of said wiring board from the external terminal and detouring said opening and reversing direction toward an inside direction of said wiring board to reach the electrode.

2. The device as claimed in claim 1, wherein said wiring line detours said opening.

3. The device as claimed in claim 2, said device further comprising a resin bonded to the wiring board and the semiconductor chip.

4. A semiconductor device, comprising:
    a wiring board having a first surface and a second surface, said wiring board having a center portion and a peripheral portion surrounding said center portion;
    a semiconductor chip arranged on said center portion of said first surface of said wiring board and having at least one chip pad;
    a plurality of external terminals arranged on said center portion of said second surface of said wiring board;
    an opening piercing through said wiring board to expose said chip pad and a surface surrounding said chip pad of said semiconductor chip and arranged at the periphery between said center and peripheral portions;
    a wiring line running from said chip pad exposed by said opening toward said peripheral portion, running and detouring said opening between said peripheral and said center portions, and running at said center portion to connect with said external terminal.

5. The device as claimed in claim 4, said device further comprising a resin bonded to the wiring board and the semiconductor chip.

6. The device as claimed in claim 4, wherein said chip pad is adjacent to the inside edge of the opening and far from the outside edge of the opening.

7. A semiconductor device, comprising:
    a wiring board having a first surface and a second surface, said wiring board having a center portion and a peripheral portion surrounding said center portion;
    a semiconductor chip arranged on said center portion of said first surface of said wiring board and having a group of chip pads arranged at a corner portion of said semiconductor chip, said corner portion having a first portion directly under said group of said chip pads and a second portion surrounding said first portion, said semiconductor chip having a first remaining portion except for said corner portion;
    a plurality of external terminals arranged on said center portion of said second surface of said wiring board in a matrix;
    an opening piercing through said wiring board to expose said corner portion, said wiring board having a second remaining portion not to form any opening and corresponding to said first remaining portion;
    a plurality of wiring lines each formed in said wiring board or on said second surface of said wiring board, each of said wiring lines running from the respective chip pads exposed by said opening toward said peripheral portion, running at said second remaining portion and detouring said opening between said peripheral and said center portions, and running at said center portion to connect with the respective external terminals.

8. The device as claimed in claim 7, wherein said device is a ball grid type chip size package.

9. The device as claimed in claim 7, wherein a first group of said wiring lines detours said opening clockwise and a second group of said wiring lines said opening counterclockwise.

10. The device as claimed in claim 7, wherein said chip pads are adjacent to the inside edge of the opening and far from the outside edge of the opening.

11. The device as claimed in claim 8, said device further comprising a resin bonded to the wiring board and the semiconductor chip.

* * * * *